(12) United States Patent
Lamesch et al.

(10) Patent No.: US 12,132,478 B2
(45) Date of Patent: Oct. 29, 2024

(54) LOW-COST, PROTECTED CAPACITIVE SENSING CIRCUIT FOR LOADING MODE OPERATION OF CAPACITIVE SENSORS EMPLOYING HEATER MEMBERS

(71) Applicant: IEE INTERNATIONAL ELECTRONICS & ENGINEERING S.A., Echternach (LU)

(72) Inventors: Laurent Lamesch, Reichlange (LU); Tobias Justinger, Hermeskeil (DE); Michael Puetz, Trier (DE); Thomas Faber, Schweich (DE); Christoph Wendt, Trier (DE); Johnny Lorang, Schieren (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 0 days.

(21) Appl. No.: 18/286,283

(22) PCT Filed: Apr. 8, 2022

(86) PCT No.: PCT/EP2022/059533
§ 371 (c)(1),
(2) Date: Oct. 10, 2023

(87) PCT Pub. No.: WO2022/218886
PCT Pub. Date: Oct. 20, 2022

(65) Prior Publication Data
US 2024/0275383 A1 Aug. 15, 2024

(30) Foreign Application Priority Data
Apr. 12, 2021 (LU) .................................. LU500033

(51) Int. Cl.
*H03K 17/955* (2006.01)
*B60N 2/56* (2006.01)
(Continued)

(52) U.S. Cl.
CPC ......... *H03K 17/955* (2013.01); *B60N 2/5678* (2013.01); *B60R 21/01532* (2014.10); *H03K 17/08122* (2013.01)

(58) Field of Classification Search
USPC ........................ 324/658, 660–663, 674, 676
See application file for complete search history.

(56) References Cited

U.S. PATENT DOCUMENTS

| 6,703,845 B2 | 3/2004 | Stanley et al. |
| 2001/0045733 A1* | 11/2001 | Stanley ................ H03K 17/955 180/273 |

(Continued)

FOREIGN PATENT DOCUMENTS

| EP | 3048029 A1 | 7/2016 |
| LU | 92299 B1 | 12/2015 |

(Continued)

OTHER PUBLICATIONS

J. R. Smith et al., "Electric Field Sensing for Graphical Interfaces", Special Issue on Input Devices, May 1998, pp. 1-18, IEEE Computer Graphics and Applications.

(Continued)

*Primary Examiner* — Incent Q Nguyen
(74) *Attorney, Agent, or Firm* — Reising Ethington P.C.

(57) ABSTRACT

An impedance measurement circuit for determining a complex impedance of a capacitive sensor that is configured for employing at least one electric heater member as an electrode to be operated in loading mode. The measurement circuit includes: a signal generating unit for providing an electric measurement signal; a signal sensing circuit mea- (Continued)

suring current through the at least one electric heater member; an electric heater member connection circuit comprising a plurality of MOSFETs for selectively electrically connecting the electric heater member either to the signal sensing circuit for complex impedance measurement or to a DC electric power unit for heating purposes; and a control and evaluation unit that is configured for controlling a switching status of the plurality of MOSFETs according to a predefined sequence, and for determining a complex impedance from the determined currents with reference to a complex reference potential during predefined stages of the predefined sequence.

13 Claims, 2 Drawing Sheets

(51) Int. Cl.
*B60R 21/015* (2006.01)
*H03K 17/0812* (2006.01)

(56) References Cited

U.S. PATENT DOCUMENTS

| | | |
|---|---|---|
| 2009/0295199 A1 | 12/2009 | Kincaid et al. |
| 2010/0038351 A1 | 2/2010 | Tabaczynski |
| 2011/0148648 A1 | 6/2011 | Fischer |
| 2012/0286800 A1 | 11/2012 | Maharyta |
| 2016/0101805 A1 | 4/2016 | Nishio et al. |
| 2018/0370473 A1* | 12/2018 | Lamesch .............. H03K 17/955 |

FOREIGN PATENT DOCUMENTS

| | | |
|---|---|---|
| WO | 2012113795 A1 | 8/2012 |
| WO | 2015052667 A1 | 4/2015 |
| WO | 2016062824 A1 | 4/2016 |

OTHER PUBLICATIONS

International Written Opinion corresponding to application PCT/EP2022/059533; dated Aug. 23, 2023; 6 pages.
International Search Report corresponding to application PCT/EP2022/059533; dated Aug. 23, 2023; 3 pages.

* cited by examiner

LOW-COST, PROTECTED CAPACITIVE SENSING CIRCUIT FOR LOADING MODE OPERATION OF CAPACITIVE SENSORS EMPLOYING HEATER MEMBERS

TECHNICAL FIELD

The invention relates to an impedance measurement circuit for determining a complex impedance of a capacitive sensor that is configured for employing at least one electric heater member as an electrode to be operated in loading mode, and a capacitive sensing device, particularly for use in automotive applications, including such impedance measurement circuit.

BACKGROUND

Capacitive sensors and capacitive measurement and/or detection devices employing capacitive sensors have a wide range of applications, and are among others used for the detection of the presence and/or the position of a conductive body or body portion in the vicinity of an antenna electrode.

As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In the field of automotive vehicle sensor applications, it is known to employ capacitive sensors for providing input to Automatic Driver Assistance Systems (ADAS), for instance for the purpose of a seat belt reminder (SBR) system or an activation control for an auxiliary restraint system (ARS). Sensed signals can serve as a basis for making decisions by an ADAS, for instance for a decision to deploy an air bag system to a specific vehicle seat or not.

Capacitive occupant sensing systems have been proposed in great variety, e.g. for controlling the deployment of one or more airbags, such as e.g. a driver airbag, a passenger airbag and/or a side airbag. Another example for the use of capacitive sensors in an automotive vehicle application is the so-called Hands off Detection (HoD) system, in which one or more sensors provide information about whether a driver has his hands on a steering wheel of a vehicle or not. This information can be transferred to an ADAS such as an Adaptive Cruise Control (ACC), which, based on the provided sensor signal, can alert the driver and remind him or her to take control of the steering wheel again. In particular, such HoD systems can be used in support to fulfill a requirement of the Vienna convention that the driver must remain in control of the vehicle at all times. HoD systems may as well be employed in a parking assistance system or an ADAS that is configured for evaluating a driver activity at high speed.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier, which is connected to the sensing electrode and which converts the current flowing into the sensing electrode into a voltage proportional to this current.

The complex impedance measurement for determining an unknown impedance that is equivalent to an influence of an object or living being on the electric field of a sensing electrode of a capacitive sensor is often determined by a sampling measurement, for instance of a sense current, by employing one or more analog-to-digital converters (ADC). Solutions have been proposed in the prior art to lower the requirement regarding a sampling frequency of the ADC, which is an important factor for complexity and cost effectiveness.

Some capacitive sensors are designed as sense-only capacitive sensors having a single sense electrode. Also, quite often capacitive sensors are used that comprise a sense electrode and a so-called "guard electrode" that are proximally arranged and mutually galvanically insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

The equivalent-time sampling method is also used in a low-cost complex impedance measurement circuit for guard-sense capacitive sensors operated in loading mode described in WO 2016/062824 A1. A microcontroller uses a combination of several synchronized PWM outputs to generate a low distortion sine wave by summing the PWM outputs and filtering the summed signal. The sine wave is used as guard voltage for the guard electrode. The unknown impedance is measured by impinging the guard voltage on the sense electrode by a transistor connected in common base configuration and then transferring the sense current through the common base connected transistor to a transimpedance amplifier made out of a second transistor connected in common emitter configuration. The output voltage at the collector of the second transistor is measured by an ADC input of the microcontroller. The microcontroller translates the ADC output values into the unknown impedance to be measured by doing a software demodulation of the ADC output values. Additionally, in order to increase the precision of the measurement, a reference impedance can be connected in parallel to the unknown impedance and be used by the microcontroller to eliminate gain errors of the signal sensing circuit.

Capacitive sensing systems which are used in the control of airbag systems or other safety-related applications may be considered as safety-relevant system components. It may thus be necessary to monitor the good functioning of the different components of the sensor (sensing electrode and/or guard electrode) in order to rule out a false reading by the capacitive occupancy or proximity detection system.

Specifically in Hands off Detection (HoD) systems, a guard electrode is often employed for shielding one or more sense electrodes from inner parts of a vehicle steering wheel. Any damage of an electric connection of the guard electrode to a signal-processing circuitry of a capacitive sensor system can jeopardize the reliability of measurement results of the capacitive sensor.

In the prior art it has also been proposed to combine capacitive sensors with heating devices, particularly in vehicle steering wheels, and also in vehicle seats.

For example, WO 2015/052667 A1 describes an occupancy sensing with heating devices and the use of non-guarded MOSFETs (metal-oxide-semiconductor field-effect transistors) to separate heating current from measurement current. A system comprises a heater located within a steering wheel and a heater located within a vehicle seat, wherein the heater in the steering wheel is a first plate and the heater in the vehicle seat is a second plate, and a shift in a signal is monitored between the first plate, the second plate, or both so that a presence and absence of an occupant is detected. The heater in the steering wheel and the heater in the vehicle seat are a sensor.

A solution employing diodes and impedances in a guarded sensing circuit using a heater is proposed in US 2010/0038351 A1. A combined heating system and occupant sensing system for a vehicle seat includes first and second electrodes connected in series and a controller configured to direct a heating current to the first and second electrodes current. The controller is configured to isolate the first and second electrodes from the heating current and, at the same time, provide a sensing current to only one of the first and second electrodes.

Inductors and MOSFETs in a guarded sensing circuit using a heater as sensor electrode is described in an occupant sensor of U.S. Pat. No. 6,703,845 B2. An oscillatory or pulsed first signal is applied to a seat heating element that is operatively connected to first and second impedances that isolate the first signal from the source and sink of power to the heating element. In another embodiment, third and fourth impedances are connected to the first and second impedances at respective nodes, and a second signal substantially equal to the first signal is operatively coupled to the nodes. In another embodiment, the first signal is applied to an electrode, and the second signal is applied to the heating element, which shields the electrode from influence by the seat. In another embodiment, the first signal is applied to a first electrode that is shielded from the heating element by a second electrode operatively coupled to the second signal. The impedances may, for example, be provided by inductors or electronic switches.

Further, a capacitive occupant detection system and method for detecting an occupant seated in a vehicle seat is known from US 2011/0148648 A1. An electrode is arranged in a seat proximate to an expected location of an occupant for sensing an occupant proximate thereto. The electrode may be integrated with a seat heater. Control circuitry controls the seat heater. A signal generator is coupled to the electrode and configured output to the electrode a plurality of signals at a plurality of frequencies. Occupant detection circuitry detects voltages responsive to the plurality of signals at the plurality of frequencies and detects a state of occupancy based on the detected voltages. An LC circuit coupled to the electrode and the control circuitry suppresses capacitance generated by the control circuitry. A curve fit algorithm is used to extract real and imaginary parts of the unknown impedance to be measured.

EP 3 048 029 A1 describes a steering wheel heater device that includes: a heating wire; a power line connected in series to the heating wire, for supplying the heating wire with power; a ground line connected in series to the heating wire; a lead-out wire connected to a point along a wiring pattern formed of the heating wire; and a contact detection circuit electrically connected to the wiring pattern formed of the heating wire through the lead-out wire, wherein a portion of the wiring pattern is connected in series between the ground line and the contact detection circuit.

In US 2016/0101805 A1, a steering wheel heater device includes: a steering wheel heater configured of an electrical resistor, which produces heat by electrical energy; an inductor; at least one switch; and a sensor circuit, wherein the inductor is connected in series to a first terminal of the steering wheel heater, the at least one switch turns on and off the supply of power to the steering wheel heater, the sensor circuit is electrically connected to the first terminal and determines whether a detected subject is in contact with a steering wheel based on a magnitude of capacitance of the steering wheel heater, and the at least one switch is at least one of a switch connected in series to the first terminal of the steering wheel heater via the inductor and a switch connected in series to a second terminal of the steering wheel heater.

SUMMARY

It is therefore an object of the invention to provide a cost-efficient solution for a capacitive sensing device with an impedance measurement circuit connectable to at least one capacitive sensor to be operated in loading mode, which is configured for employing at least one electric heater member as an electrode to be operated in loading mode, wherein the impedance measurement circuit uses low-cost components and provides improvements regarding speed of measurement and potential affection of measurement due to the necessary separation of the electric heater member from an electric heating power source for performing a complex impedance measurement. Further, the impedance measurement circuit should preferably provide a protection of the heater member and the measurement circuit itself against a potential polarity reversal of the electric heating power source. Also, the impedance measurement circuit should preferably be capable of providing at least one out of sensor diagnostics or electronic circuit diagnostics.

The capacitive sensing device should in particular be configured for use in automotive applications such as hands off detection (HoD) for electrically heatable vehicle steering wheels and occupancy detection of electrically heatable vehicle seats.

In one aspect of the present invention, the object is achieved by an impedance measurement circuit for determining a complex impedance of a capacitive sensor that is configured for employing at least one electric heater member as an electrode to be operated in loading mode.

The proposed impedance measurement circuit comprises:
a signal generating unit for providing an electric measurement signal,
a signal sensing circuit including current measuring means for sensing a current flowing through the at least one electric heater member in response to the signal generating unit measurement signal,
an electric heater member connection circuit comprising a plurality of metal-oxide-semiconductor field-effect transistors (MOSFETs) for selectively electrically connecting the at least one electric heater member either to the signal sensing circuit for complex impedance measurement or to a DC electric power unit for heating purposes, and at least two DC bias units, each DC bias unit including a DC voltage source, wherein
at least a first and a second MOSFET are electrically connectable to one output port each of the DC electric power unit and in series with the at least one electric heater member, which is connectable between the first and the second MOSFET, and
at least a first protection MOSFET, which is electrically connected in series to the first MOSFET such that the intrinsic diode of the first protection MOSFET is connected in reverse to the intrinsic diode of the first MOSFET, and is connectable in series to the at least one electric heater member, and
the at least two DC bias units are configured for providing a predefined DC voltage across the drain and source terminals of the at least first protection MOSFET.

The proposed impedance measurement circuit further includes a control and evaluation unit that is at least configured for:
controlling a switching status of the plurality of MOSFETs according to a predefined sequence, and
determining a complex impedance from the determined currents with reference to a complex reference potential during predefined stages of the predefined sequence.

The phrases "configured for" and "configured to", as used in this application, shall in particular be understood as being specifically programmed, laid out, furnished or arranged. The term "plurality", as used in this application, is meant to express a quantity of at least two. It is further noted herewith that the terms "first", "second", etc. are used in this application for distinction purposes only, and are not meant to indicate or anticipate a sequence or a priority in any way.

For the purpose of controlling a switching status of the plurality of MOSFETs, the control and evaluation unit may be equipped with a plurality of voltage output ports, and appropriate electric lines are provided between the voltage output ports and gate terminals of the MOSFETs.

For heating purposes, the first and second MOSFET can readily be controlled into a status of low ohmic resistance between source and drain terminals to provide electric connections between the DC electric power units terminals and the at least one heater member. For impedance measurement purposes, the first and second MOSFET can readily be controlled into a status of high ohmic resistance between source and drain terminals to separate the at least one heater member from the electric power unit.

The series combination of the first MOSFET and the first protection MOSFET can provide a protection of the at least one electric heater member and the electric heater member connection circuit against a potential reversal of the DC electric power unit polarity. Without this reverse polarity protection, the at least one electric heater member would stay on continuously in case of a reverse polarity of the electric power unit, which must be avoided for safety reasons.

As in this application the MOSFETs are exclusively used as electronic switches, the status of low ohmic resistance may be referred to as an 'ON' switching status of the MOSFET, and the status of high ohmic resistance may be referred to as an 'OFF' switching status of the MOSFET.

By an appropriate adjustment of the two DC bias units it can be avoided that during determining a complex impedance a measurement current may flow through the intrinsic diodes of the second MOSFET and the first protection MOSFET, which can potentially falsify the determined value of the complex impedance measurement. Further, by employing the two DC bias units the drain-source capacitance of the MOSFETs can substantially be reduced, which further reduces a systematic error of the complex impedance measurement.

It is also noted that the proposed constant DC biasing by the two DC bias units is independent of the voltage provided by the electric power unit. As a result, the drain-source capacitance of the MOSFETs under consideration is not modulated by any changes of the electric power unit voltage, which can also improve the impedance measurement accuracy.

In particular, the proposed impedance measurement circuit can be used in capacitive sensing devices in automotive applications such as hands off detection devices for electrically heatable vehicle steering wheels, and seat occupancy detection and/or classification devices for an electrically heatable vehicle seat or vehicle seats.

The term "automotive", as used in this patent application, shall particularly be understood as being suitable for use in vehicles including passenger cars, trucks, semi-trailer trucks and buses. The term "vehicle", as used in this application, shall particularly be understood to encompass passenger cars, trucks, semi-trailer trucks and buses.

The signal generating unit may be designed as a passive and amplitude-controlled generator unit that comprises a plurality of synchronized pulse width modulation units, wherein the signal generating unit is configured to weight and to sum output signals of the plurality of synchronized pulse width modulation units having a plurality of different fundamental measurement frequencies, and a passive low-pass filter unit connected in series to the summed output signals. In this way, a high measurement speed and a strong EMI robustness can be accomplished at the same time.

These features also have an advantageous technical effect on their own, which is independent of other individual features identified herein.

The current measurement means may include at least one transimpedance amplifier, which may be based on at least one operational amplifier.

The at least one electric heater member may serve as a sensor electrode or, in other applications, it may serve as a guard electrode of the capacitive sensor.

In preferred embodiments of the impedance measurement circuit, the control and evaluation unit is configured for applying a software demodulation method to a voltage signal that is representative of a sensed current and that is digitally converted by an analog-to-digital converter unit, for determining a real part and an imaginary part of the complex impedance of the capacitive sensor. These features also have an advantageous technical effect on their own, which is independent of other individual features identified herein.

The term "software demodulation", as used in this application, shall be understood particularly as a software demodulation method that is configured to recover, relative to a local oscillator, the in-phase component and the quadrature component from a composite input signal. In particular, software demodulation provided by vector demodulation means is commonly known in the art of sensor signal processing and therefore need not be described in detail herein. By using a software demodulation method, a cost-efficient solution with low hardware complexity for evaluating sensor signals can be provided.

The use of a plurality of paralleled software demodulators for applying the software demodulation method can allow a simultaneous evaluation of a plurality of different fundamental measurement frequencies in the electric measurement signal.

In this way, the complex impedances can be determined from the signals provided by the current measuring means with large measurement speed, a high level of flexibility and low hardware effort.

The same benefits can be accomplished in an alternative way if the control and evaluation unit is configured for applying a complex discrete Fourier transform (DFT) or a complex fast Fourier Transform (FFT) to a voltage signal that is representative of a sense current and that is digitally converted by the analog-to-digital converter unit. These features also have an advantageous technical effect on their own, which is independent of other individual features identified herein.

In preferred embodiments of the impedance measurement circuit, the gate terminal of the at least first protection MOSFET is electrically DC coupled to a terminal, i.e. depending on the regular polarity of the electric power unit either drain or source, of the second MOSFET that is connectable with an opposite side of the connectable at least one heater member. The DC coupling may be provided in a direct, i.e. galvanic manner, or it may be provided by an auxiliary electronic circuit, which is capable of transferring DC potential. These embodiments are of special interest for applications in which the signal generating unit is configured to also provide an AC guard signal to guard nodes between which the at least one electric heater member and one or more protection MOSFETs are connected in series. In this case, a dedicated AC guarded gate drive circuit of the protection MOSFETs for substantially eliminating an effect of the gate-source capacitance on the measurement accuracy is not required, because if the guard nodes are AC guarded so are the gates of the protection MOSFETs.

Preferably, the impedance measurement circuit further comprises a second protection MOSFET that is connectable in series with the at least one electric heater member between the at least one electric heater member and the second MOSFET. This can provide additional protection in case of a reverse polarity of the electric power unit, if the intrinsic diodes of the first protection MOSFET and the second protection MOSFET are reverse biased with regard to the first MOSFET and the second MOSFET, respectively.

In such embodiments, for the reasons already explained it is also preferred that the gate terminal of the second protection MOSFET is electrically connected to a terminal, i.e. depending on the regular polarity of the electric power unit either drain or source, of the first protection MOSFET that is connectable with an opposite side of the connectable at least one heater member.

In preferred embodiments of the impedance measurement circuit, the plurality of MOSFETs further comprises line MOSFETs that are connected in series in electric lines between the at least one electric heater member and the signal sensing circuit. The control and evaluation unit is configured to control the conducting states of the line MOSFETs such that the electric lines provide electric connections of low resistance (typically<10 Ohm) during a stage of complex impedance measurement and provide large electric resistance (typically>1 MOhm) during a stage of providing electric power to the at least one heater member. In this way, the at least one heater member and the electric power unit can effectively be electrically disconnected for protection of the signal sensing circuit and, if applicable, the signal generating unit during operation of the at least one heater member, and the at least one heater member can effectively be electrically connected to the signal sensing circuit for achieving an increased speed of measurement during a complex impedance measurement.

In preferred embodiments of the impedance measurement circuit, the signal generating unit is configured, in at least one stage of operation, to provide an AC guard signal to guard nodes between which the at least one electric heater member and the protection MOSFETs are connected in series. In this way, an automatic AC guarding of the gate terminals of the protection MOSFETs during complex impedance measurements can be accomplished. Preferably, the AC guard signal can be provided to the guard nodes by electric coupling via electronic switches and/or via MOSFETs.

Preferably, the control and evaluation unit comprises a microcontroller that includes a processor unit, a digital data memory unit, a microcontroller system clock, and an analog-to-digital converter unit having at least one analog-to-digital converter for at least converting an output signal of the signal sensing circuit.

Microcontrollers that are equipped as described above are commercially available nowadays in many variations and at economic prices. In this way, an automated operation of the impedance measurement circuit can be enabled. Further, in an appropriate embodiment, an increased measurement speed can be accomplished with a low-cost microcontroller.

In preferred embodiments of the impedance measurement circuit, the microcontroller is configured to execute an equivalent-time sampling method. In this way, the impedance measurement can be carried out with sufficient precision and a high speed of measurement with low-cost hardware.

Preferably, the equivalent-time sampling method includes employing an incremental time delay between subsequent samples that is equal to one clock period of the microcontroller system clock.

The term "equivalent-time sampling method", as used in this application, shall particularly be understood as a sampling method in which only an instantaneous input signal is measured at the sampling instant and the input signal is only sampled once per trigger. In the subsequent sampling trigger, a small timely delay is added and another sample is taken. The intended number of samples determines the resulting number of cycles needed to reproduce the input signal.

In this way, requirements on hardware properties, particularly regarding speed of signal handling and processing, can be a lowered, which results in lower hardware costs and complexity of design.

In another aspect of the invention, a capacitive sensing device is provided. The capacitive sensing device comprises an embodiment of the impedance measurement circuit disclosed herein, and a capacitive sensor having at least one electric heater member that serves as an electrode to be operated in loading mode in one operation period and as an electric heater in another, distinct operation period.

In this way, the obvious benefit of a double function of the sense or guard electrode can be achieved in combination with the described advantages of the impedance measurement circuit.

In yet another aspect of the invention, a method of operating the capacitive sensing device disclosed herein for sensor diagnostic purposes. The method comprises at least the following steps:

controlling the first and the second MOSFET to drive an electric current through the at least one heater member, determining an output voltage of the electric power unit and the strength of the electric current, calculating an electric resistance of the at least one heater member from the determined output voltage and electric current strength, comparing the calculated electric resistance with a predefined threshold value for the electric resistance, and generating an output signal that is indicative of a result of the step of comparison.

In this way, diagnostics of the electrodes that are designed as an electric heater member can advantageously be accomplished. For instance, the output voltage of the electric power unit may be determined by an ADC of an employed microcontroller, and the strength of the electric current may be determined via a current sense output of the first MOSFET.

In another aspect of the invention, a method of operating a capacitive sensing device comprising a impedance measurement circuit as disclosed herein, in which the signal generating unit is configured, in at least one stage of operation, to provide an AC guard signal to guard nodes between which the at least one electric heater member and the protection MOSFETs are connected in series, for electronic circuit diagnostic purposes. The method comprises at least the following steps:

controlling the first and the second MOSFET into a status of high ohmic resistance to prevent an electric current from flowing out of the electric power unit through the at least one heater member, determine a complex impedance between the guard nodes and a terminal of the at least one electric heater member, comparing a magnitude of the determined complex impedance with a predefined threshold value for the magnitude of the complex determined impedance, and generating an output signal that is indicative of a result of the step of comparison.

The complex impedance between the guard nodes and a terminal of the at least one electric heater member is substantially established by a parallel electric connection of the drain-source and gate-source impedances, i.e. mainly capacitances, of the protection MOSFETs. If the magnitude of the determined complex impedance significantly differs from the predefined threshold value for the magnitude, which represents a parallel electric connection of nominal and a priori known drain-source and gate-source MOSFET capacitances, a result of the electronic circuit diagnostic is negative, indicating that an integrity of the electronic circuit is affected. With the proposed method, diagnostics of the electronic circuit can readily be provided.

In another aspect of the invention, the use of the capacitive sensing device disclosed herein in an electrically heatable vehicle steering wheel for capacitive hands off detection is proposed. The at least one electric heater member is arranged at and configured for heating the vehicle steering wheel.

In a further aspect of the invention, the use of the capacitive sensing device disclosed herein in an electrically heatable vehicle seat for seat occupancy detection and/or classification is proposed. The at least one electric heater member is arranged at and configured for heating the vehicle seat.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies embodiments of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

In order to avoid unnecessary repetitions, only differences with respect to the first embodiment will be described. For features that are not described in FIG. 2 or 3 reference is made to the description of the first embodiment or a corresponding preceding embodiment.

In the different figures, the same parts are always provided with the same reference symbols or numerals, respectively. Thus, they are usually only described once.

DETAILED DESCRIPTION

Figure 1:
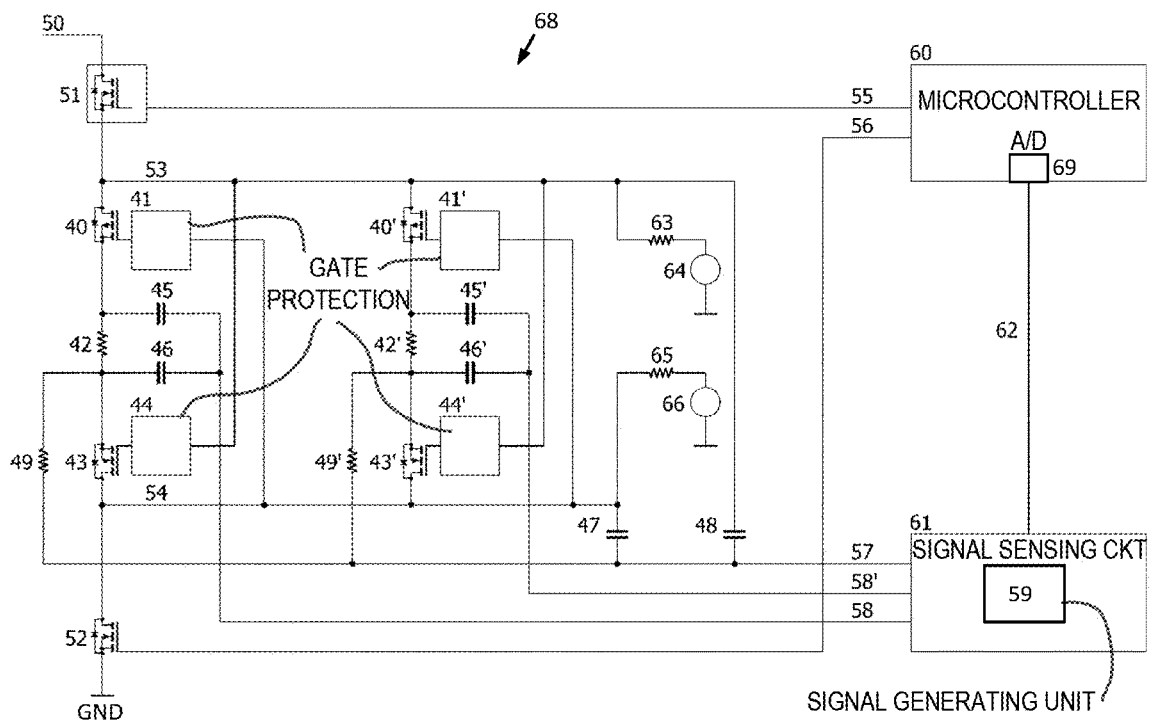
FIGS. 1 to 3 each show a layout of a capacitive sensing device with a possible embodiment of an impedance measurement circuit in accordance with the invention.
Figure 2:
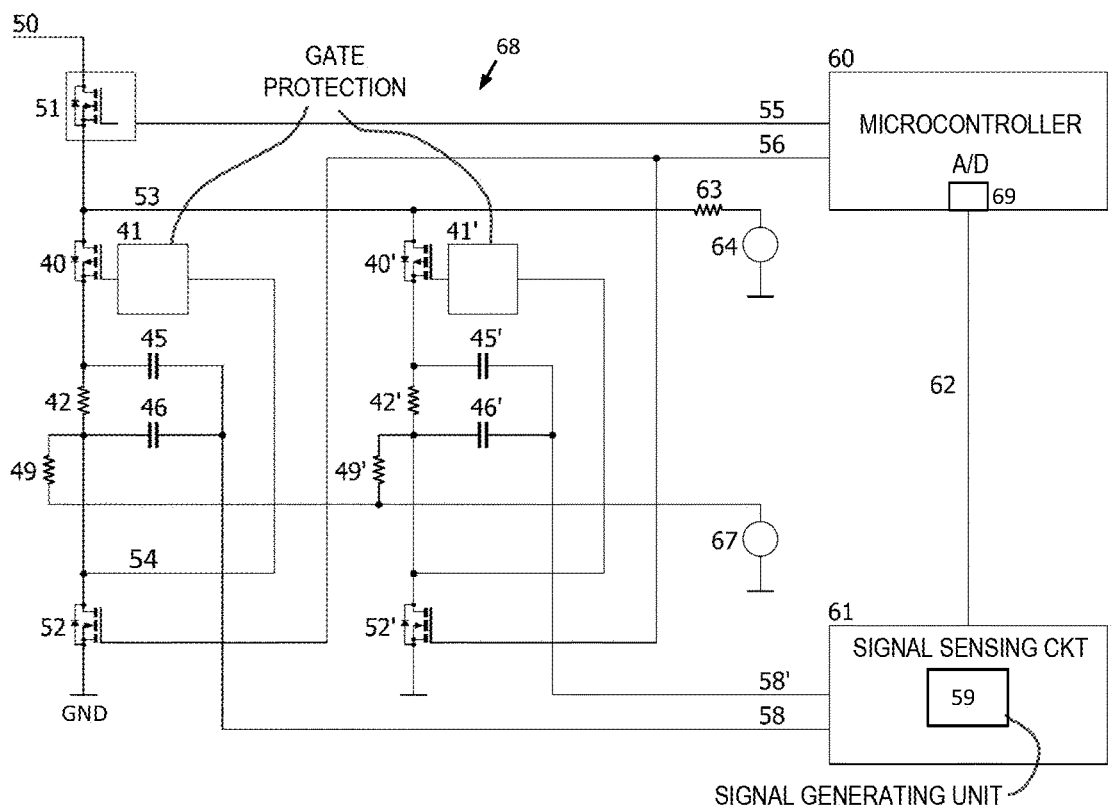
Figure 3:
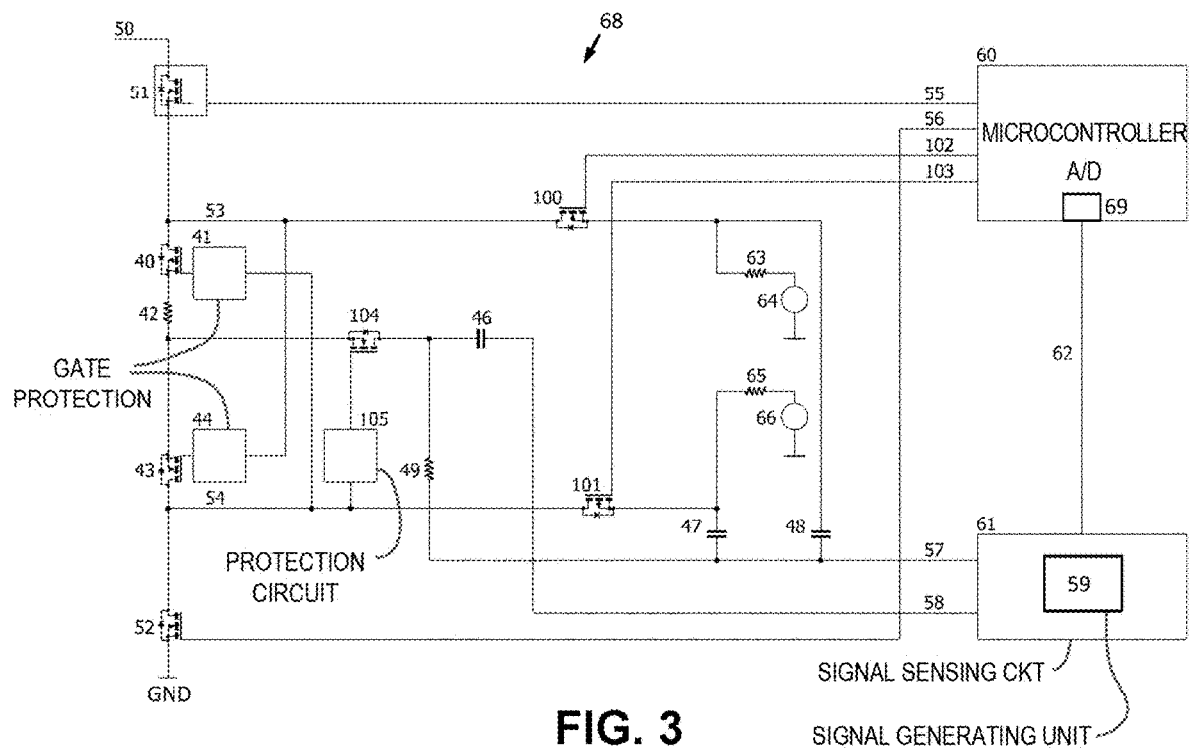

FIGS. 1 to 3 each show a layout of a capacitive sensing device with a capacitive sensor having and employing at least one electric heater member 42 as an electrode to be operated in loading mode, and a possible embodiment of an impedance measurement circuit in accordance with the invention.

Each impedance measurement circuit comprises a signal generating unit 59 for providing an electric measurement signal, a signal sensing circuit 61 for sensing a current flowing through the at least one electric heater member 42 in response to the signal generating unit measurement signal, an electric heater member connection circuit 68 comprising a plurality of MOSFETs, at least two DC bias units, each DC bias unit including a DC voltage source, and a control and evaluation unit that comprises a microcontroller 60. The control and evaluation unit is at least configured for controlling a switching status of the plurality of MOSFETs according to a predefined sequence and is further configured for determining a complex impedance from the determined currents with reference to a complex reference potential during predefined stages of the predefined sequence. Further details are given in the respective description for each of the figures.

The microcontroller 60 of the impedance measurement circuit includes a processor unit, a digital data memory unit, a microcontroller system clock and an analog-to-digital converter unit having a plurality of analog-to-digital converters 69. The signal generating unit 59 may be designed as a passive, amplitude-controlled sine shaping pulse generator unit that forms part of the microcontroller 60 or the signal sensing circuit 61.

In the following description, the term "guard node" is meant to specify a connecting location of the impedance measurement circuit to which a guard electrode, respectively, of the capacitive sensor is connectable. Measuring the complex impedance of the capacitive sensor is equivalent to measuring the unknown complex impedance (or, briefly, unknown impedance) between sensor sense and ground potential.

FIG. 1 shows a possible embodiment of the impedance measurement circuit in accordance with the invention, which uses several electric heater members 42, 42', for example steering wheel or seat heater members, as capacitive sense electrodes in an AC guarding mode. The technique of AC guarding is described in U.S. Pat. No. 6,703,845 B2 for one channel. Two channels are shown in FIG. 1, but the number can also be one or more than two. One channel is exemplarily described in the following, and the description is valid for any channel. For heating purposes, battery voltage from an electric heating current supply is applied to and symbolized by battery voltage terminals 50, GND. The impedance measurement circuit includes remotely controllable electric connection means formed as a first and a second MOSFET 51, 52, and protection MOSFETs 40, 40', 43, 43'. MOSFET 51, serving as a high side switch, and MOSFET 52 are switched on by digital outputs 55, 56 of the microcontroller 60. Electric lines 62 are provided for connecting the microcontroller 60 and a signal sensing circuit 61.

Gate protection circuits 41, 44 limit the gate-source voltage to below the maximum allowed value and may comprise for example a gate series resistance and two reverse-connected series zener diodes between gate and source of each MOSFET 40, 43. MOSFET 40, in this case a PMOS type, is switched on as its gate is grounded when MOSFET 52 switches node 54 to ground. MOSFET 43, in this case an NMOS type, is also switched on as its gate is connected to battery voltage when MOSFET 51 as the high side switch connects node 53 to battery voltage. Thereby, heater member 42 is supplied with electric current and is heating. The arrangement of MOSFETs 40, 43 yields a protection of the heater member 42 and switching circuit against a reverse connection of the battery without any additional cost of dedicated components. Without reverse polarity protection, the heater member 42 would stay on continuously in the case of a reverse polarity, which must be avoided. The intrinsic diodes in MOSFETs 40, 43 are reverse-biased, and the gate-source voltage of the NMOS MOSFET 43 is negative and the gate-source voltage of the PMOS MOSFET 40 is positive, switching both MOSFETs off. The connection of the gates of MOSFETs 40, 43 to the drains (nodes 53, 54) of the respectively other MOSFET avoids dedicated AC guarded gate driver circuits for both MOSFETs. An AC guarded gate driver is required to substantially eliminate the effect of the gate-source capacitances on the measurement accuracy. As nodes 53, 54 are AC guarded, the MOSFET gates are automatically AC guarded too. Additionally, compared to FIG. 7 in U.S. Pat. No. 6,703,845 B2, which has an RC low-pass filter in front of the gates for AC guarding purpose, the circuit shown in FIG. 1 allows a faster turn-on and turn-off of the MOSFETs, which is critical if a high heating duty cycle is required. For capacitive measurement purposes, MOSFET 51 high side switch and MOSFET 52 are switched off by the digital outputs 55, 56 of the microcontroller 60. MOSFET 40 is switched off as its gate is pulled towards its source via the heater member 42 and the intrinsic diode of MOSFET 43. MOSFET 43 is also switched off as its gate is pulled towards its source via the heater member 42 and the intrinsic diode of MOSFET 40. Thereby, heater member 42 is cut off from the battery and from ground. Nodes 53, 54 are then brought to AC guard potential via capacitors 47, 48, which are connected to the guard output 57 of signal sensing circuit 61. Capacitors 47, 48 can also be replaced by electronic switches, for example MOSFETs, to avoid the slow charging and discharging of capacitors 47, 48 during switchover from heating to measurement mode. Also, the heating part can be disconnected from the DC biased AC guard nodes and the DC biased sense input of the measurement circuit, as will be described in the following for the impedance measurement circuit illustrated in FIG. 3.

DC bias voltage source 64 and bias resistor 63 set the DC bias voltage of node 53. DC bias voltage source 66 and bias resistor 65 set the DC bias voltage of node 54. DC bias of the heater member 42 and thereby of the sources of the MOSFETs 40, 43 is set by resistor 49 and the DC voltage of the guard output 57. DC biasing allows the MOSFETs 40, 43 to have a defined DC voltage between their respective drains and sources, reverse biasing their intrinsic diodes in order to avoid measurement currents flowing through the diodes. Additionally, a DC bias decreases the drain-source capacitance, which decreases measurement errors by increasing the impedance between sense and guard. Additionally, the constant DC biasing method employed here is independent of the battery voltage and thereby avoids the modulation of the drain-source capacitance of the MOSFETs by battery voltage changes, which would influence the measurement accuracy. This is another advantage over cited prior art U.S. Pat. No. 6,703,845 B2. For example, the DC bias of node 53 may be set to 1 V, and the DC bias of node 54 may be set to 4 V and the DC bias of the guard output 57 and thereby the sources of MOSFETs 40, 43 may be set to 2.5 V.

Heater member 42 is AC coupled to the sense input 58 of signal sensing circuit 61 by capacitor 45, or capacitor 46, or both capacitors 45, 46. Capacitors 45, 46 can also be replaced by electronic switches, for example MOSFETs, to avoid the slow charging and discharging of capacitors 45, 46 during switchover from heating to measurement mode.

The advantage of the impedance measurement circuit in FIG. 1 compared to that of U.S. Pat. No. 6,703,845 B2 is that the common guard nodes 53, 54 only need one pair of MOSFETs 51, 52 to separate the guard for all channels from battery and ground, and still allows an independent measurement of the unknown admittance 1, 1' of each channel.

As an alternative to using a PMOS type MOSFET for MOSFET 40, PMOS type MOSFET 40 and gate protection circuit 41 can also be replaced by an NMOS type MOSFET operating similarly to high side MOSFET switch 51. In this case, a dedicated gate driver is needed, but the overall cost may still be lower due to the lower price of an NMOS type MOSFET. This option is for example preferable if the MOSFETs and gate drivers can be integrated in to an ASIC (application-specific integrated circuit). The reverse polarity protection is still valid due to the presence of MOSFET 43.

As shown in FIG. 1, the DC bias voltages of nodes 53 and 54 are defined by DC bias sources 64 and 66, respectively, and the DC bias voltage of the heater 42 is defined by the DC voltage of guard output 57. Alternatively, the DC bias of heater 42 can also be defined by injecting a known DC current into the upper end of resistor 49, thereby creating a DC level shift, and the DC bias of one of the nodes 53 or 54 can be defined by the DC voltage of guard output 57, instead of a combination of a resistor, capacitor and DC bias source. This also applies to the circuit in FIG. 3. Also, instead of using the combination of a resistor, a capacitor and a DC voltage source, the DC bias of any of the nodes 53, 54 can also be generated by using an additional dedicated guard voltage driver with an appropriate DC voltage level. This also applies to the circuit in FIG. 3.

FIG. 2 shows another possible embodiment of the impedance measurement circuit in accordance with the invention, which uses several electric heater members 42, 42', for example steering wheel or seat heater members, as capacitive sense electrodes in a DC guarding mode. Two channels are shown in FIG. 2, but the number can also be one or more than two. One channel is described below, the description is valid for any channel.

For heating purposes, battery voltage is applied to battery voltage terminal 50. MOSFET 51, serving as a high side switch, and MOSFET 52 are switched on by digital outputs 55, 56 of the microcontroller 60. Gate protection circuit 41 limits the gate-source voltage to below the maximum allowed value and comprises for example a gate series resistance and two reverse-connected series zener diodes between gate and source of each MOSFET 40. MOSFET 40, in this case a PMOS type, is switched on as its gate is grounded as MOSFET 52 switches node 54 to ground. Thereby, heater member 42 is supplied with current and heating.

The arrangement of MOSFET 40 yields a protection of the heater member 42 and switching circuit against a reverse connection of the battery without any additional cost of dedicated components.

For capacitive measurement purposes, MOSFET 51 as high side switch and MOSFET 52 are switched off by the digital outputs 55, 56 of the microcontroller 60. MOSFET 40 is switched off as its gate is pulled towards its source via the heater member 42. Thereby, heater member 42 is cut from the battery and from ground.

DC bias voltage source 64 and bias resistor 63 set the DC bias voltage of node 53. DC bias of the heater member and thereby of the source of MOSFET 40 and the drain of MOSFET 52 is set by resistor 49 and the DC bias source 67. DC biasing allows the MOSFETs 40, 52 to have a defined DC voltage between their respective drains and sources, which is reverse biasing their intrinsic diodes in order to avoid measurement current flowing through the diodes. Additionally, a DC bias decreases the drain-source capacitance, which decreases measurement errors by increasing the impedance between sense and AC ground. Additionally, the constant DC biasing method employed here is independent of the battery voltage and thereby avoids the modulation of the drain-source capacitance of the MOSFETs by battery voltage changes, which influences the measurement accuracy. For example, the DC bias of node 53 may be set to 1.0 V and source of MOSFET 40 may be set to 2.5 V.

The advantage of the impedance measurement circuit shown in FIG. 2 compared to prior art WO 2015/052667 A1 is that the dependency of the MOSFET capacitances on the battery voltage and thereby the dependency of the measurement error on the battery voltage that exists in WO 2015/052667 A1 is eliminated. The advantage of the impedance measurement circuit in FIG. 2 compared to those shown in FIG. 1 and in U.S. Pat. No. 6,703,845 B2 is that it is less complex and thereby more cost-effective than the impedance measurement circuit shown in FIG. 1, and also than the circuit illustrated in FIG. 3 of U.S. Pat. No. 6,703,845 B2.

Another advantage of the impedance measurement circuit shown in FIG. 2 is that an AC guard is not needed, which allows the application of simple measurement circuits for signal sensing circuit 61, for example a capacitive measurement circuit based on the switched capacitance principle, as described in US 2012/0286800 A1.

Diagnostics of the sense electrodes, which are in this case the heater members 42, 42', is often required. For the impedance measurement circuits shown in FIG. 1 and FIG. 2, diagnostics can be realized by switching the heater members 42, 42' on for a short time and using the ADC of the microcontroller 60 to measure the battery voltage and the actual current flowing out of MOSFET 51 via its current sense output, calculating the total paralleled heater member resistance by dividing the measured voltage by the measured current, and comparing the measured resistance to a threshold.

The integrity of the connection of the signal sensing circuit 61 to the MOSFETs 40, 43 and the integrity of the MOSFETs 40, 43 can be diagnosed by measuring the impedance between sense and guard. The impedance is substantially composed of the paralleled drain-source and gate-source impedances of MOSFETs 40, 43. If the measured impedance deviates significantly from the paralleled nominal drain-source gate-source MOSFET capacitances, the integrity diagnostics result is negative. The integrity diagnostics of the MOSFETs 40, 43 is important in order to diagnose AC cross-conduction between the heater members, which leads to cross-coupling of the different measurement channels.

FIG. 3 shows another possible embodiment of the impedance measurement circuit in accordance with the invention, which significantly reduces the time between an end of heating and a start of measurement by disconnecting the heating part of the circuit from the measurement part, thereby avoiding charging or discharging the capacitors necessary for the AC guarding respectively the AC coupling of the sense node.

The difference to the impedance measurement circuit shown in FIG. 1 is that the voltage of bias source 66 is set to 5.0 V.

When heating, microcontroller 60 switches MOSFETs 100, 101 off via control outputs 102, 103. MOSFET 104 is switched off because its gate is at a slightly lower voltage than its source, the voltage difference between gate and source being defined by the voltage drop across MOSFET 43 in its ON state. MOSFET 104 is protected by gate protection circuit 105.

After disabling heating and before starting the measurement, microcontroller 60 switches on MOSFETs 100, 101. The node 54 is brought to a DC voltage of 5.0 V, driven by the bias voltage source 66 which generates a DC voltage of 5.0 V in this case. As the drain of MOSFET 104 is set to 2.5 V, and its source is kept at a voltage which is smaller than the sum of 2.5 V and the forward voltage of the internal diode of MOSFET 104, MOSFET 104 also switches on. Provided that the capacitors 46, 47, 48 are chosen significantly larger than the parasitic capacitances of the MOSFETs 51, 40, 43, 52, no significant charge is sunk out of capacitors 46, 47 or 48, and the settling time of the nodes 53, 54 and the sense node are significantly reduced.

The connection of the gate of MOSFET 104 to node 54 allows the AC guarding of the gate of MOSFET 104, thereby reducing measurement error. Another option is to drive the gate of MOSFET 104 directly by microcontroller 60 or via a dedicated guarded gate driver.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. An impedance measurement circuit for determining a complex impedance of a capacitive sensor that is configured for employing at least one electric heater member as an electrode to be operated in loading mode, the impedance measurement circuit comprising:
    a signal generating unit for providing an electric measurement signal,
    a signal sensing circuit including current measuring means for sensing a current flowing through the at least one electric heater member in response to the signal generating unit measurement signal,
    an electric heater member connection circuit comprising a plurality of MOSFETs for selectively electrically connecting the at least one electric heater member either to the signal sensing circuit for complex impedance measurement or to a DC electric power unit for heating purposes, and at least two DC bias units, each DC bias unit including a DC voltage source, wherein:
        at least a first and a second MOSFET are electrically connectable to one output port each of the DC electric power unit and in series with the at least one electric heater member, which is connectable between the first and the second MOSFETs, and
        at least a first protection MOSFET, which is electrically connected in series to the first MOSFET such that the intrinsic diode of the first protection MOSFET is connected in reverse to the intrinsic diode of the first MOSFET, and is connectable in series to the at least one electric heater member,
        the at least two DC bias units are configured for providing a predefined DC voltage across the drain and source terminals of the at least first protection MOSFET, and
    a control and evaluation unit that is at least configured for:
        controlling a switching status of the plurality of MOSFETs according to a predefined sequence, and
        determining a complex impedance from the determined currents with reference to a complex reference potential during predefined stages of the predefined sequence.

2. The impedance measurement circuit as claimed in claim 1, wherein the gate terminal of the first protection MOSFET is electrically DC coupled to a terminal of the second MOSFET that is connectable with an opposite side of the connectable at least one heater member.

3. The impedance measurement circuit as claimed in claim 1, further comprising a second protection MOSFET that is connectable in series with the at least one electric heater member between the at least one electric heater member and the second MOSFET.

4. The impedance measurement circuit as claimed in claim 3, wherein the gate terminal of the second protection MOSFET is electrically connected to a terminal of the first protection MOSFET that is connectable with an opposite side of the connectable at least one heater member.

5. The impedance measurement circuit as claimed in claim 1, wherein the plurality of MOSFETs further comprises line MOSFETs that are connected in series in electric lines between the at least one electric heater member and the signal sensing circuit, wherein the control and evaluation unit is configured to control the conducting states of the line MOSFETs such that the electric lines provide electric connections of low resistance during a stage of complex impedance measurement and provide large electric resistance during a stage of providing electric power to the at least one heater member.

6. The impedance measurement circuit as claimed in claim 1, wherein the signal generating unit is configured, in at least one stage of operation, to provide an AC guard signal to guard nodes between which the at least one electric heater member and the protection MOSFETs are connected in series.

7. Method of operating a capacitive sensing device comprising an impedance measurement circuit as claimed in claim 6 for electronic circuit diagnostic purposes, the method comprising at least the following steps:
    controlling the first and the second MOSFET into a status of high ohmic resistance to prevent an electric current from flowing out of the electric power unit through the at least one heater member,
    determine a complex impedance between the guard nodes and a terminal of the at least one electric heater member,
    comparing a magnitude of the determined complex impedance with a predefined threshold value for the magnitude of the complex determined impedance, and
    generating an output signal that is indicative of a result of the step of comparison.

8. The impedance measurement circuit as claimed in claim 1, wherein the control and evaluation unit comprises a microcontroller that includes a processor unit, a digital data memory unit, a microcontroller system clock, and an analog-to-digital converter unit having at least one analog-to-digital converter for at least converting an output signal of the signal sensing circuit.

9. The impedance measurement circuit as claimed in claim 1, wherein the microcontroller is configured to execute an equivalent-time sampling method.

10. A capacitive sensing device, comprising
an impedance measurement circuit as claimed in claim 1, and
a capacitive sensor having at least one electric heater member that serves as an electrode to be operated in loading mode in one operation period and as an electric heater in another, distinct operation period.

11. Method of operating the capacitive sensing device as claimed in claim 10 for sensor diagnostic purposes, the method comprising at least the following steps:
controlling the first and the second MOSFETs to drive an electric current through the at least one heater member,
determining an output voltage of the electric power unit and the strength of the electric current,
calculating an electric resistance of the at least one heater member from the determined output voltage and electric current strength,
comparing the calculated electric resistance with a predefined threshold value for the electric resistance, and
generating an output signal that is indicative of a result of the step of comparison.

12. Use of a capacitive sensing device as claimed in claim 10 in an electrically heatable vehicle steering wheel for capacitive hands off detection, wherein the at least one electric heater member is arranged at and configured for heating the vehicle steering wheel.

13. Use of a capacitive sensing device as claimed in claim 10 in an electrically heatable vehicle seat for seat occupancy detection and/or classification, wherein the at least one electric heater member is arranged at and configured for heating the vehicle seat.

* * * * *